(12) United States Patent
Kambara

(10) Patent No.: US 12,471,193 B2
(45) Date of Patent: Nov. 11, 2025

(54) LIGHT EMITTING ELEMENT DRIVE DEVICE AND LIGHT EMITTING SYSTEM

(71) Applicant: ROHM CO., LTD., Kyoto (JP)

(72) Inventor: Daisuke Kambara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 69 days.

(21) Appl. No.: 18/604,826

(22) Filed: Mar. 14, 2024

(65) Prior Publication Data

US 2024/0334565 A1 Oct. 3, 2024

(30) Foreign Application Priority Data

Mar. 31, 2023 (JP) ................................. 2023-056974

(51) Int. Cl.
*H05B 45/34* (2020.01)
*H05B 45/10* (2020.01)
*H05B 45/3725* (2020.01)

(52) U.S. Cl.
CPC ............. *H05B 45/34* (2020.01); *H05B 45/10* (2020.01); *H05B 45/3725* (2020.01)

(58) Field of Classification Search
CPC .... H05B 45/34; H05B 45/10; H05B 45/3725; H05B 45/325; H05B 45/14; H05B 45/46
See application file for complete search history.

(56) References Cited

U.S. PATENT DOCUMENTS

| 10,004,121 | B2 * | 6/2018 | Eum ...................... H05B 45/44 |
| 10,562,438 | B2 * | 2/2020 | Katsura .................. H05B 45/10 |
| 10,952,299 | B1 * | 3/2021 | Xiong ................. H02M 1/0058 |
| 11,229,098 | B2 * | 1/2022 | Kanbara .............. B60Q 1/1415 |
| 2022/0206519 | A1 * | 6/2022 | Zhong ..................... G05F 1/461 |
| 2023/0061314 | A1 * | 3/2023 | Kanbara .............. H05B 45/395 |

FOREIGN PATENT DOCUMENTS

| DE | 102017215736 | 3/2019 |
| JP | 2017-010810 | 1/2017 |
| JP | 2018-185963 | 11/2018 |

OTHER PUBLICATIONS

DE OA—German Patent and Trademark Office, Office Action in German Appln. No. 102024107948.7, dated Nov. 7, 2024, 8 pages (with English translation).

* cited by examiner

*Primary Examiner* — Minh Tran
(74) *Attorney, Agent, or Firm* — Fish & Richardson P.C.

(57) ABSTRACT

A light emitting element drive device includes: a first voltage holder configured to hold a first difference voltage, which is a difference between an error voltage when a light emitting element is in an off state and a first voltage that is a lowest voltage of a slope voltage; a second voltage holder configured to hold a second difference voltage, which is a difference between the error voltage when the light emitting element is in an on state and the first voltage of the slope voltage; and a corrector configured to correct a voltage difference between the error voltage and the first voltage of the slope voltage based on a difference between the second difference voltage and the first difference voltage.

10 Claims, 9 Drawing Sheets

LIGHT EMITTING ELEMENT DRIVE DEVICE AND LIGHT EMITTING SYSTEM

CROSS-REFERENCE TO RELATED APPLICATION

This application is based upon and claims the benefit of priority from Japanese Patent Application No. 2023-056974, filed on Mar. 31, 2023, the entire contents of which are incorporated herein by reference.

TECHNICAL FIELD

The present disclosure relates to a light emitting element drive device.

BACKGROUND

Conventionally, an LED (light emitting diode) with low power consumption and long lifespan has been used for various purposes. The LED is an example of a light emitting element. As an LED drive device that drives LEDs, there exists a device capable of driving multiple channels of LEDs.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Comparative Example

First, a comparative example will be described for comparison with embodiments of the present disclosure. Description of the comparative example will make problems clearer.

Figure 1:
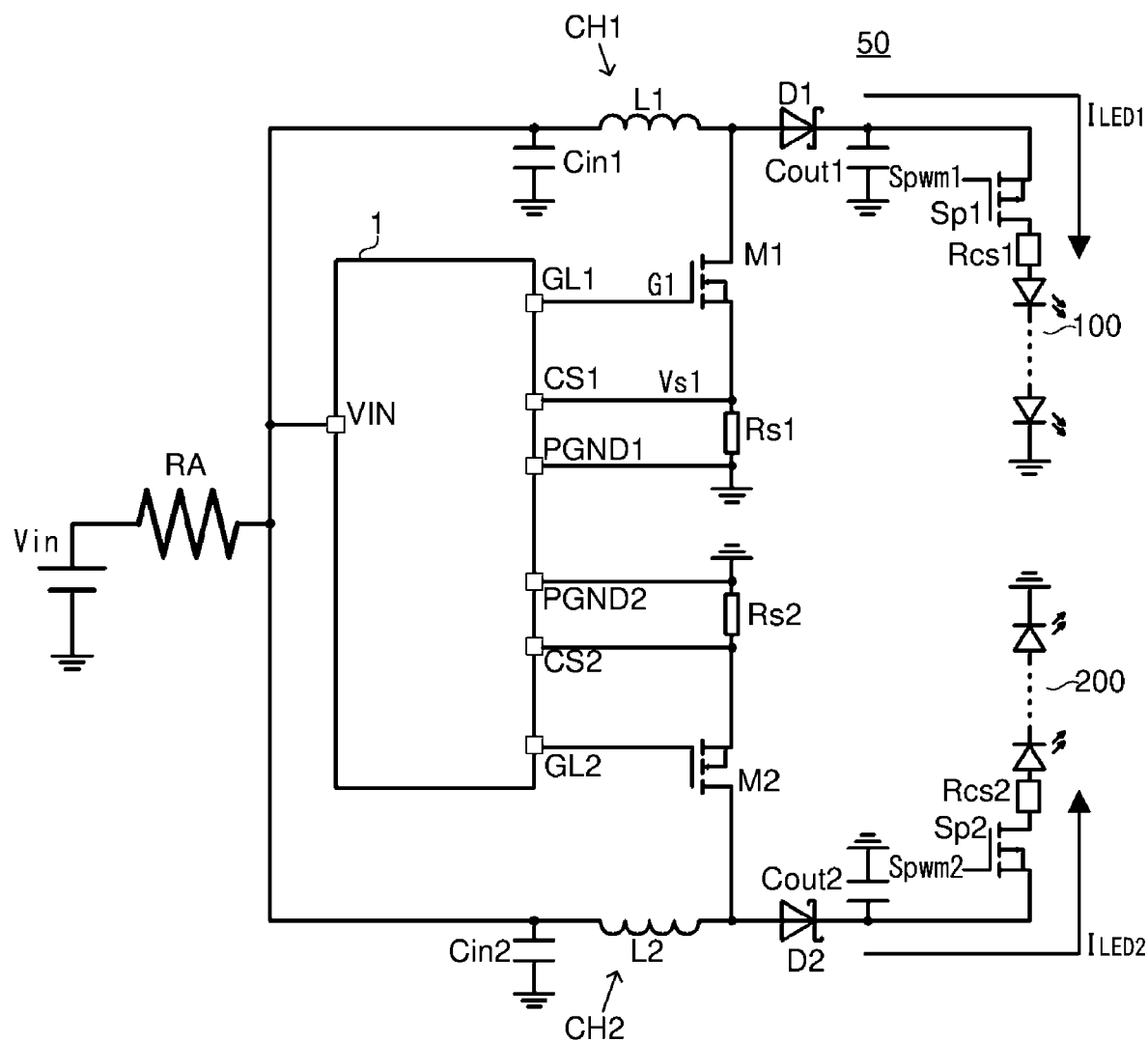
FIG. 1 is a view showing a configuration example of a light emitting system.

FIG. 1 is a view showing a configuration example of a light emitting system. A light emitting system 50 shown in FIG. 1 includes an LED drive device (light emitting element drive device) 1, an LED array 100, a switching power supply circuit CH1, an LED array 200, and a switching power supply circuit CH2.

The LED drive device 1 drives multiple channels (in the present embodiment, two channels as an example) of the LED arrays (light emitting elements) 100 and 200. That is, the LED array 100 corresponds to a first channel, and the LED array 200 corresponds to a second channel. The switching power supply circuit CH1 is provided correspondingly to the LED array 100, and the switching power supply circuit CH2 is provided correspondingly to the LED array 200. The switching power supply circuits CH1 and CH2 boost an input voltage Vin to generate power supply voltages Vout1 and Vout2 and supply them to the LED arrays 100 and 200, respectively.

Since the switching power supply circuits CH1 and CH2 have a same configuration, only the switching power supply circuit CH1 will be representatively described here. The switching power supply circuit CH1 includes an input capacitor Cin1, an inductor L1, a diode D1, an output capacitor Cout1, a switching element M1, and a sense resistor Rs1. A first end of the input capacitor Cin1 is connected to a first end of the inductor L1 together with an application end of the input voltage Vin. A second end of the inductor L1 is connected to an anode of the diode D1. A cathode of the diode D1 is connected to a first end of the output capacitor Cout1. The switching element M1 is constituted by an N-channel MOSFET (metal-oxide-semiconductor field-effect transistor). A drain of the switching element M1 is connected to the second end of the inductor L1. A source of the switching element M1 is connected to a first end of the sense resistor Rs1. A second end of the sense resistor Rs1 is connected to an application terminal of the ground potential.

The LED drive device 1 is a packaged semiconductor device with a built-in semiconductor chip. Correspondingly to the switching power supply circuit CH1, the LED drive device 1 includes a terminal (gate terminal) GL1, a terminal (sense terminal) SC, and a terminal (ground terminal) PGND1, as external terminals for establishing electrical connection with the outside. Further, correspondingly to the switching power supply circuit CH2, the LED drive device 1 includes a terminal GL2, a terminal CS2, and a terminal PGND2. Further, the LED drive device 1 includes a terminal (input power supply terminal) VIN to which the input voltage Vin can be applied.

The terminal GL1 is connected to a gate of the switching element M1. The first end of the sense resistor Rs1 is connected to the terminal CS1. The second end of the sense resistor Rs1 is connected to the terminal PGND1.

Figure 2:
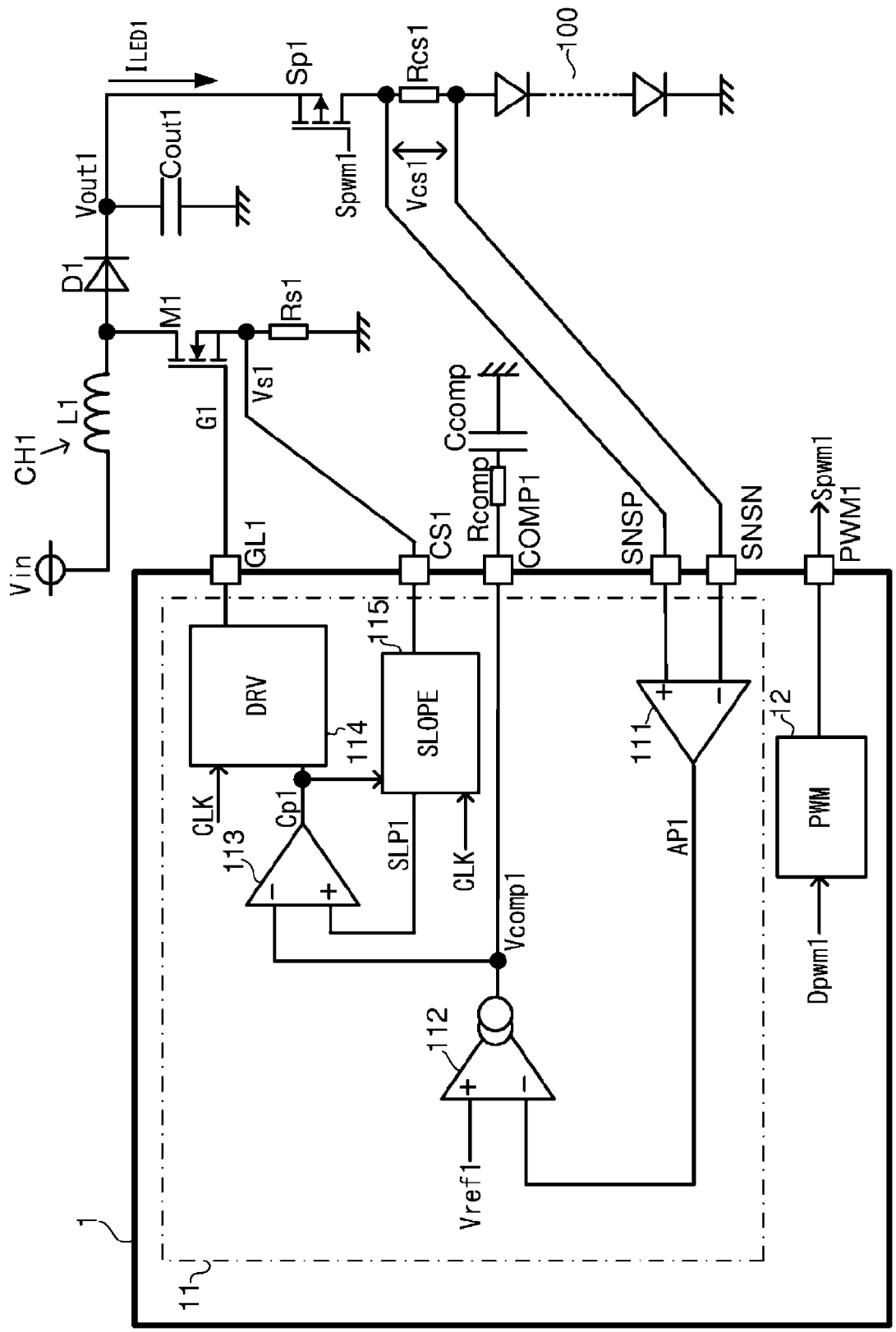
FIG. 2 is a view showing an example of an internal configuration of an LED drive device.

A PWM (pulse width modulation) switch Sp1 and a current detection resistor Rcs1 are disposed on a path between an output terminal of the switching power supply circuit CH1 and an anode terminal of the LED array 100. Here, description will be made with reference to FIG. 2. FIG. 2 is a view showing an example of an internal configuration of the LED drive device 1. In addition, FIG. 2 shows a configuration corresponding to the first channel (the LED array 100 and the switching power supply circuit CH1) in the LED drive device 1, and although not shown, a configuration corresponding to the second channel (the LED array 200 and the switching power supply circuit CH2) is also provided in the same way.

The PWM switch Sp1 is constituted by a P-channel MOSFET, and a gate thereof is driven by a PWM signal Spwm1 that is output from a terminal (PWM output terminal) PWM1 provided in the LED drive device 1. That is, the PWM switch Sp1 is turned on and turned off by the PWM signal Spwm1.

The PWM signal Spwm1 is generated by a PWM dimmer 12 embedded in the LED drive device 1. The PWM dimmer 12 generates the PWM signal Spwm1 based on a PWM dimming signal Dpwm1 input thereto. Both the PWM dimming signal Dpwm1 and the PWM signal Spwm1 are pulse signals. The pulse signals are formed by a high level and a low level. When the PWM dimming signal Dpwm1 is at an on level (first logic level), it is considered that the PWM signal Spwm1 is at a level for turning the PWM switch Sp1 on. When the PWM dimming signal Dpwm1 is at an off level (second logic level), it is considered that the PWM signal Spwm1 is at a level for turning the PWM switch Sp1 off. When the PWM switch Sp1 is in an on state, the power supply voltage Vout1 is applied to the anode terminal of the LED array 100 via the PWM switch Sp1, thereby turning the LED array 100 on. When the PWM switch Sp1 is in an off state, the supply of the power supply voltage Vout1 is cut off, thereby turning the LED array 100 off. Thus, according to an on-duty of the PWM dimming signal Dpwm1, the PWM switch Sp1 is driven on and off to turn the LED array 100 on and off, thereby performing PWM dimming of the LED array 100. In addition, DC dimming can also be performed by setting the on-duty to be 100%. In this case, the PWM switch Sp1 is always in the on state.

When the PWM switch Sp1 is in the on state, due to an LED current $I_{LED}1$ flowing through the LED array 100, a current detection signal Vcs1 is generated across the current detection resistor Rcs1. Vcs1 is a voltage signal. The current detection signal Vcs1 is applied between a terminal (positive sense terminal) SNSP and a terminal (negative sense terminal) SNSN provided in the LED drive device 1.

The LED drive device 1 includes a power supply controller 11 configured to control switching of the switching element M1 in the switching power supply circuit CH1. The power supply controller 11 includes an amplifier 111, an error amplifier 112, a comparator 113, a driver 114, and a slope voltage generator 115.

The current detection signal Vcs1 applied between the terminal SNSP and the terminal SNSN is amplified by the amplifier 111 and becomes a current detection signal AP1. The current detection signal AP1 is input to an inverting input terminal (−) of the error amplifier 112, and a reference voltage Vref1 is applied to a non-inverting input terminal (+) of the error amplifier 112. An output terminal of the error amplifier 112 is connected to a terminal (phase compensation terminal) COMP1 provided in the LED drive device 1. A resistor Rcomp and a capacitor Ccomp for phase compensation are externally connected to the terminal COMP1.

The error amplifier 112 outputs an error voltage Vcomp1 according to an error between the current detection signal AP1 and the reference voltage Vref1. The error voltage Vcomp1 is input to an inverting input terminal of the comparator 113.

A sense voltage Vs1, which is a voltage signal, is generated in the sense resistor Rs1 based on a current flowing through the switching element M1. The sense voltage Vs1 is applied to the terminal (sense terminal) CS1 provided in the LED drive device 1. The slope voltage generator 115 generates a low level voltage SLP1_L based on the sense voltage CS1 applied to the terminal CS1, and generates a sawtooth slope voltage SLP1 by using the low level voltage SLP1_L as a reference. The low level voltage SLP1_L is a lowest voltage of the slope voltage SLP1.

The slope voltage SLP1 is input to the non-inverting input terminal of the comparator 113. The comparator 113 compares the error voltage Vcomp1 and the slope voltage SLP1, and outputs a comparator output Cp1 as a comparison result. The driver 114 generates a gate signal G1 based on the comparator output Cp1 and a clock CLK, and outputs the gate signal G1 from the terminal GL1 to the gate of the switching element M1. The clock CLK is a pulse signal having a predetermined period, and defines a period of PWM control.

Specifically, when the clock CLK rises, the driver 114 outputs the gate signal G1 as a high level. Thus, the switching element M1 is turned on. In addition, when the clock CLK rises, the slope voltage generator 115 starts increasing a voltage from the low level voltage SLP1_L to generate the slope voltage SLP1. When the slope voltage SLP1 rises and reaches the error voltage Vcomp1, the comparator output Cp1 is switched from a low level to a high level, which triggers the driver 114 to generate the gate signal G1 as a low level. Thus, the switching element M1 is turned off. Further, at this time, the slope voltage generator 115 sharply decreases the slope voltage SLP1 to the low level voltage SLP1_L. Thereafter, when the clock CLK rises again, the driver 114 sets the gate signal G1 to a high level again, and the slope voltage generator 115 increases the slope voltage SLP1 from the low level voltage SLP1_L. Thus, an on time of the switching element M1 is determined based on the slope voltage SLP1 and the error voltage Vcomp1, thereby performing the PWM control. The current detection signal AP1 is controlled to match the reference voltage Vref1 by the PWM control, and the LED current $I_{LED}1$ is controlled to a target value.

Figure 3:
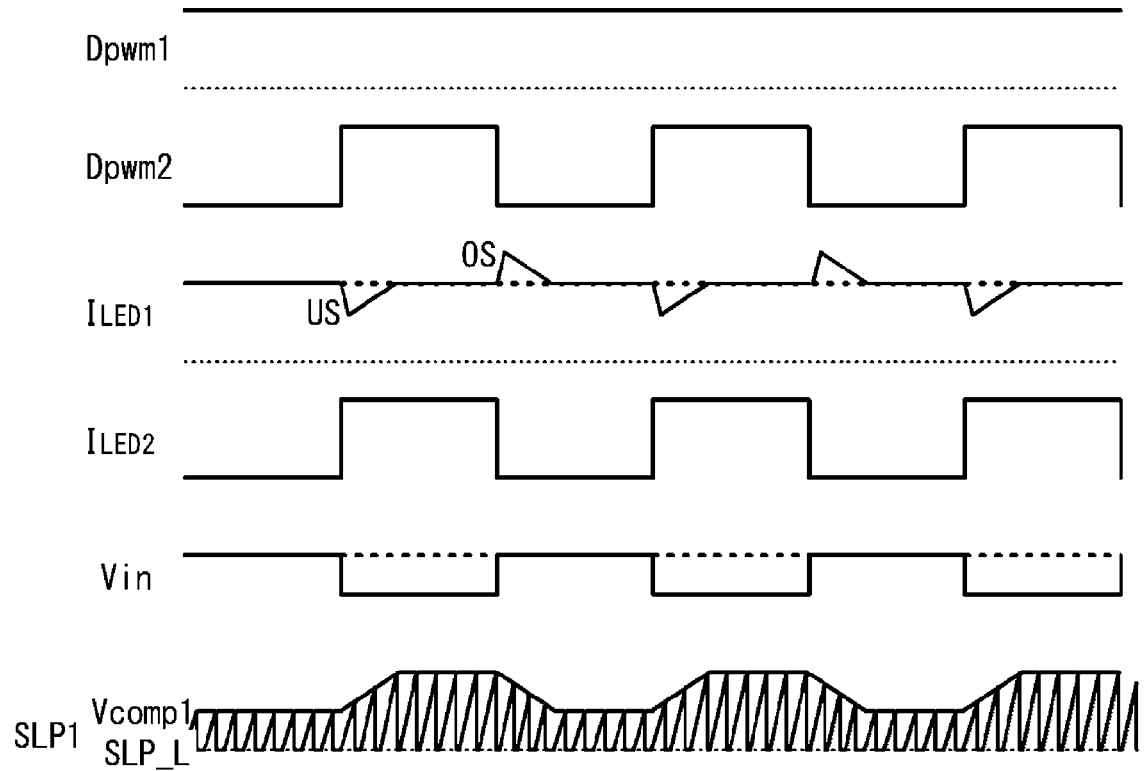
FIG. 3 is a timing chart showing an operation example according to a comparative example.

FIG. 3 is a timing chart showing an operation example of the light emitting system 50 according to a comparative example, and shows waveform examples of the PWM dimming signal Dpwm1 (first channel), a PWM dimming signal Dpwm2 (second channel), the LED current $I_{LED}1$ (first channel), an LED current $I_{LED}2$ (second channel), the input voltage Vin, and the slope voltage SLP1 (first channel) sequentially from the top.

FIG. 3 shows, as an example, an operation when the first channel is DC dimmed (that is, the PWM switch Sp1 is always turned on) and the second channel is PWM dimmed. Further, the PWM dimming signal has, for example, a high level as an on level and a low level as an off level. As shown in FIG. 3, since the PWM dimming signal Dpwm1 is always at a high level, the first channel is DC dimmed, and since the PWM dimming signal Dpwm2 repeats a high level and a low level, the second channel is PWM dimmed.

Here, a wiring resistance RA exists between the application terminal of the input voltage Vin (specified value) and the terminal VIN (see FIG. 1). When the PWM dimming signal Dpwm2 is switched from a low level to a high level, i.e., when the PWM switch Sp2 is switched from an off state to an on state, a voltage drop occurs in the wiring resistance RA due to the LED current $I_{LED}2$ flowing through the LED array 200, and the input voltage Vin actually applied to the switching power supply circuit CH1 decreases from the specified value. Thus, a switching duty (a ratio of an on time to a PWM cycle), which is required in the PWM control performed by the power supply controller 11, changes. However, due to a response delay of the PWM control, the switching duty is insufficient immediately after the PWM dimming signal Dpwm2 is switched from a low level to a high level, and the LED current $I_{LED}1$ decreases from the target value (undershoot US). Thereafter, when the switching duty reaches a required value, the LED current $I_{LED}1$ is stabilized at the target value.

Further, when the PWM dimming signal Dpwm2 is switched from a high level to a low level, i.e., when the PWM switch Sp2 is switched from an on state to an off state, the LED current $I_{LED}2$ does not flow and the input voltage Vin returns to the specified value. However, due to the response delay of the PWM control, immediately after the PWM dimming signal Dpwm2 is switched from a high level to a low level, the switching duty becomes excessive and the LED current $I_{LED}1$ increases from the target value (overshoot OS). Thereafter, when the switching duty reaches a required value, the LED current $I_{LED}1$ is stabilized at the target value.

As described above, when the second channel performs PWM dimming, in the first channel which performs DC dimming, the LED current $I_{LED}1$ repeats undershoot and overshoot, thereby degrading accuracy in the LED current. Thus, there is a possibility that noise is generated and reliability of the LED is degraded. In order to solve such problems, embodiments according to the present disclosure described below are implemented.

First Embodiment

Configurations of a light emitting system and an LED drive device according to embodiments of the present disclosure are basically the same as those shown in FIGS. 1 and 2 described above. However, in the present embodiments, the error voltage Vcomp1 can be input to the slope voltage generator 115.

Figure 4:
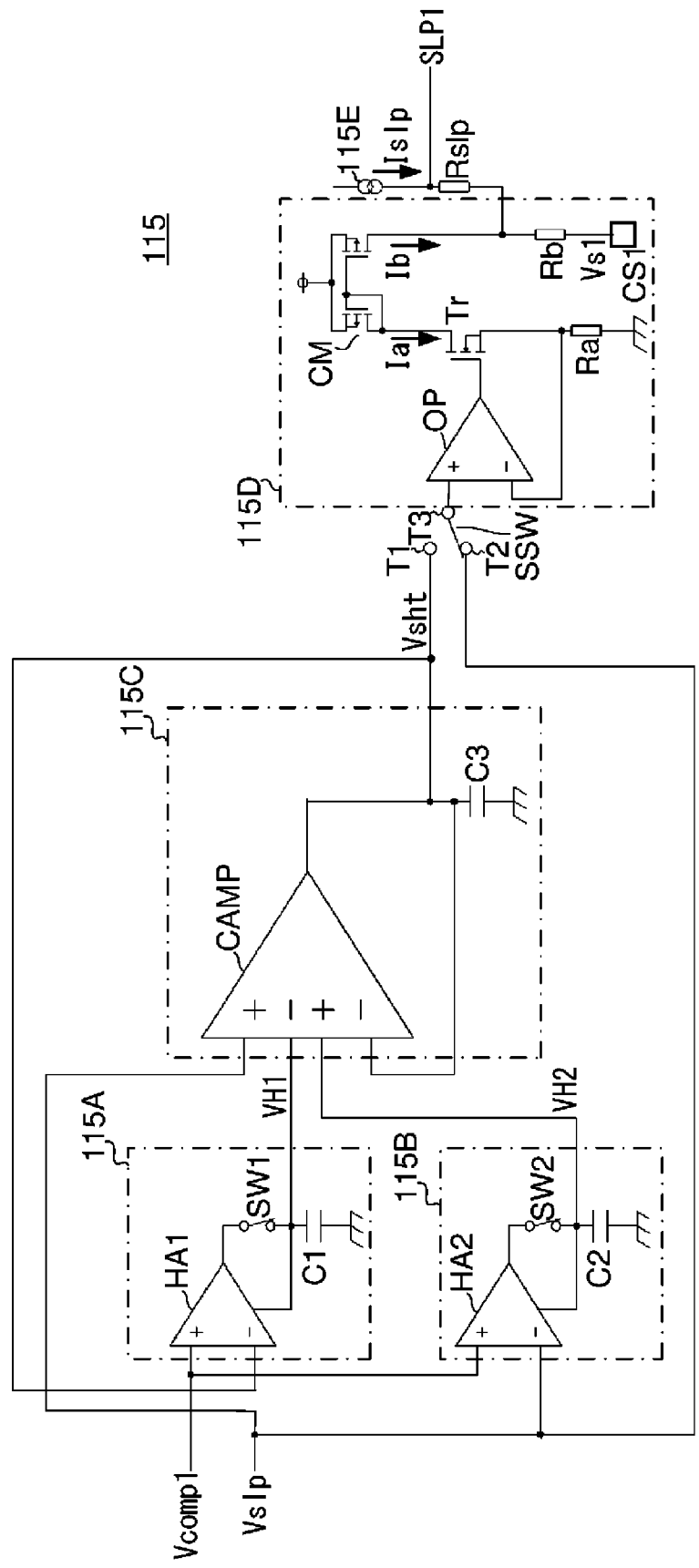
FIG. 4 is a view showing a configuration of a slope voltage generator according to a first embodiment.

FIG. 4 shows a configuration of the slope voltage generator 115 according to a first embodiment of the present disclosure. The slope voltage generator 115 shown in FIG. 4 includes a first voltage holder 115A, a second voltage holder 115B, a corrector 115C, a low level voltage generator 115D, a current source 115E, a slope resistor Rslp, and a changeover switch SSW.

The first voltage holder 115A includes a first amplifier HA1, a first switch SW1, and a first capacitor C1. An error voltage Vcomp1 is input to a non-inverting input terminal of the first amplifier HA1, and a correction voltage Vsht, which is an output of a correction amplifier CAMP to be described later, is applied to an inverting input terminal of the first amplifier HA1. The first switch SW1 is connected between an output terminal of the first amplifier HA1 and one end of the first capacitor C1. By turning the first switch SW1 on, a difference (Vcomp1−Vsht) between the error voltage Vcomp1 output from the first amplifier HA1 and the correction voltage Vsht is sampled. By turning the first switch SW1 off, the difference between the error voltage Vcomp1 and the correction voltage Vsht can be held.

The second voltage holder 115B includes a second amplifier HA2, a second switch SW2, and a second capacitor C2. The error voltage Vcomp1 is input to a non-inverting input terminal of the second amplifier HA2, and a reference voltage Vslp is applied to an inverting input terminal of the second amplifier HA2. The reference voltage Vslp is an internally fixed voltage (e.g., 1 V). The second switch SW2 is connected between an output terminal of the second amplifier HA2 and one end of the second capacitor C2. By turning the second switch SW2 on, a difference (Vcomp1−Vslp) between the error voltage Vcomp1 output from the second amplifier HA2 and the reference voltage Vslp is sampled. By turning the second switch SW2 off, the difference between the error voltage Vcomp1 and the reference voltage Vslp can be held.

The corrector 115C includes the correction amplifier CAMP and a third capacitor C3. A first inverting input terminal of the correction amplifier CAMP is connected to the one end of the first capacitor C1. Thus, a first holding voltage VH1 generated at the one end of the first capacitor C1 is applied to the first inverting input terminal of the correction amplifier CAMP. A first non-inverting input terminal of the correction amplifier CAMP is connected to the one end of the second capacitor C2. Thus, a second holding voltage VH2 generated at the one end of the second capacitor C2 is applied to the first non-inverting input terminal of the correction amplifier CAMP.

The reference voltage Vslp is applied to a second non-inverting input terminal of the correction amplifier CAMP. One end of the third capacitor C3 and an output terminal of the correction amplifier CAMP are connected to a second inverting input terminal of the correction amplifier CAMP. Thus, the correction voltage Vsht, which is a voltage available after correcting the reference voltage Vslp with a difference between the first holding voltage VH1 and the second holding voltage VH2 (Vsht=(VH2−VH1)+Vslp), is output from the output terminal of the correction amplifier CAMP.

The changeover switch SSW includes a first terminal T1, a second terminal T2, and a third terminal T3. The first terminal T1 is connected to the output terminal of the correction amplifier CAMP. The reference voltage Vslp is applied to the second terminal T2. The changeover switch SSW switches electric connection between the first terminal T1 and the third terminal T3 and electric connection between the second terminal T2 and the third terminal T3. The third terminal T3 is connected to an input terminal of a low level voltage generator 115D, which will be described later.

The low level voltage generator 115D includes an operational amplifier OP, a transistor Tr, a current mirror CM, a VI conversion resistor Ra, and an IV conversion resistor Rb. A non-inverting input terminal of the operational amplifier OP is connected to the third terminal T3. The transistor Tr is constituted by an N-channel MOSFET. An output terminal of the operational amplifier OP is connected to a gate of the transistor Tr. A source of the transistor Tr, together with an inverting input terminal of the operational amplifier OP, is connected to the VI conversion resistor Ra. A drain of the transistor Tr is connected to an input terminal of the current mirror CM. The current mirror CM is constituted by a P-channel MOSFET. An output terminal of the current mirror CM is connected to a first end of the IV conversion resistor Rb. A second end of the IV conversion resistor Rb is connected to the terminal CS1.

Thus, a source voltage of the transistor Tr is controlled to match the voltage (Vsht or Vslp) input to the non-inverting input terminal of the operational amplifier OP, and the source voltage is voltage-current converted into a current Ia by the VI conversion resistor Ra. The current Ia is mirrored into a current Ib by the current mirror CM.

The first end of the VI conversion resistor Rb is connected to a first end of the slope resistor Rslp. A second end of the slope resistor Rslp is connected to the current source 115E. The current source 115E generates a slope compensation current Islp and supplies it to the slope resistor Rslp. A slope voltage SLP1 is generated at the second end of the slope resistor Rslp. The slope voltage SLP1=Vs1+(Ib+Islp)×Rb+ Islp×Rslp. When the switching element M1 is in an off state, Vs1=0 and Islp=0. Therefore, SLP1=Ib×Rbt. In this case, SLP1 is called a low level voltage. On the other hand, when the switching element M1 is in an on state, Islp gradually increases from 0, and SLP1 becomes a voltage according to Vs1 and Islp.

Figure 5:
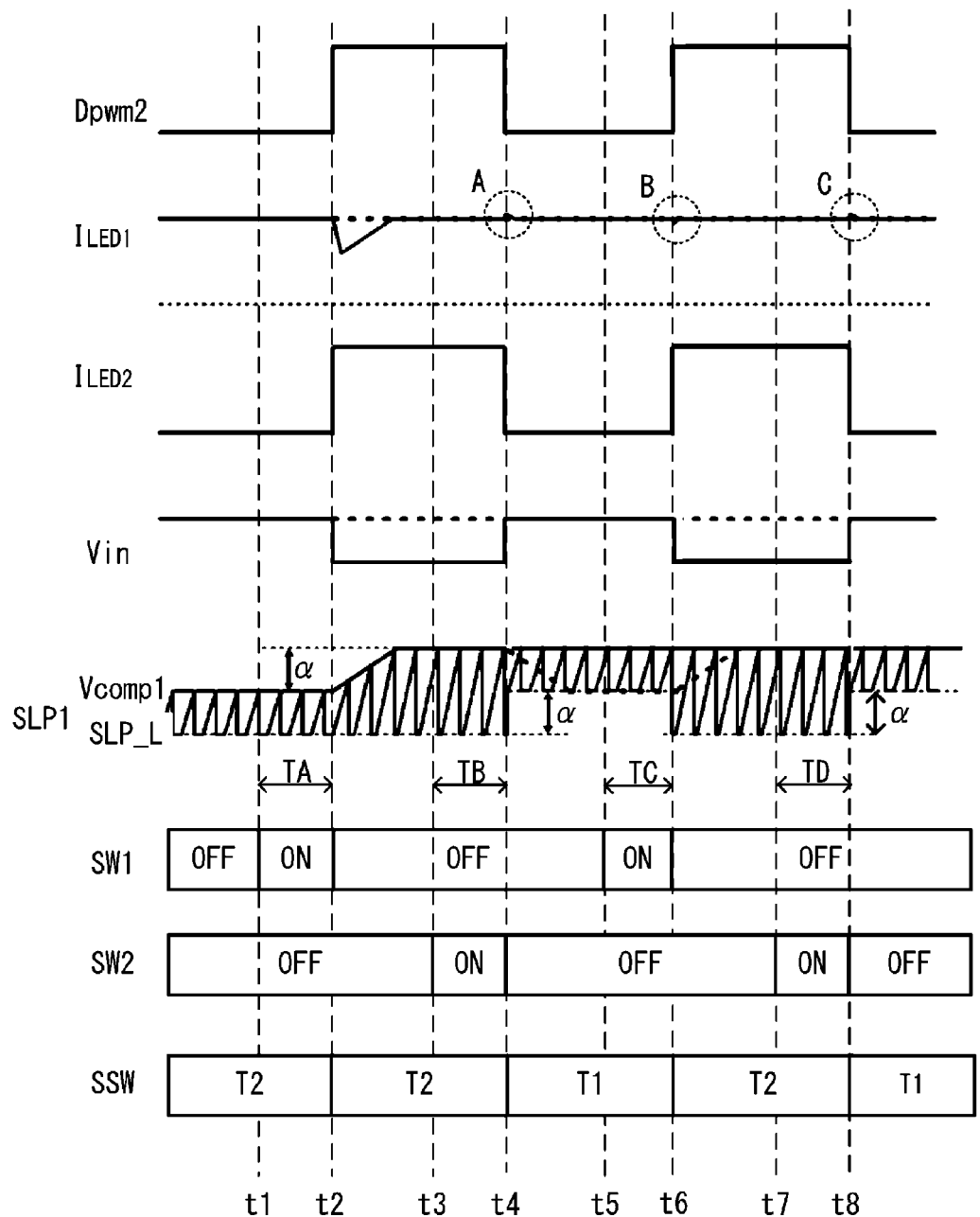
FIG. 5 is a timing chart showing an operation example according to the first embodiment.

FIG. 5 is a timing chart showing an example of an operation of the light emitting system 50 according to the present embodiment, and shows the PWM dimming signal Dpwm2, the LED current $I_{LED}1$, the LED current $I_{LED}2$, the input voltage Vin, the slope voltage SLP1, the error voltage Vcomp1, a state of the first switch SW1, a state of the second switch SW2, and a state of the changeover switch SSW sequentially from the top. In this case, DC dimming is performed in the first channel, and PWM dimming is performed in the second channel. In FIG. 5, the low level voltage SLP_L is also shown.

First, before timing t1, the PWM dimming signal Dpwm2 is at a low level (off level), the first switch SW1 is in an off state, and the second switch SW2 is in an off state. Further, the changeover switch SSW is in a second electrical connection state in which the second terminal T2 and the third terminal T3 are electrically connected to each other. At this time, VH1=VH2=0, and Vsht=Vslp. The low level voltage SLP_L of the slope voltage SLP1=Ib×Rbt=(Vslp/Ra)×Rb.

Thereafter, at timing t1, which is earlier by a predetermined time TA than timing t2 at which the PWM dimming signal Dpwm2 is switched from a low level to a high level, the first switch SW1 is turned on. Thus, a difference Diff_t1 between Vcomp1 and Vsht (=Vslp) is sampled in the first voltage holder 115A. Thereafter, at timing t2, the first switch SW1 is turned off, and the difference Diff_t1 is held in the first voltage holder 115A (holding VH1). The second switch SW2 remains in the off state, and the changeover switch SSW maintains the second electrical connection state. The low level voltage SLP_L is maintained at (Vslp/Ra)×Rb. The second electrical connection state is maintained while the PWM dimming signal Dpwm2 is at a high level.

Thereafter, at timing t3, which is earlier by a predetermined time TB than timing t4 at which the PWM dimming signal Dpwm2 is switched from a high level to a low level, the second switch SW2 is turned on. Thus, a difference Diff_t3 between Vcomp1 and Vslp is sampled in the second voltage holder 115B. At this time, the first switch SW1 is maintained in the off state.

Thereafter, at timing t4, the second switch SW2 is turned off, and the difference Diff_t3 is held in the second voltage holder 115B (holding VH2). At this time, the changeover switch SSW is switched to the first electrical connection state in which the first terminal T1 and the third terminal T3 are electrically connected to each other. Thus, the low level voltage SLP_L=(Vsht/Ra)×Rb, and Vsht=(Diff_t3−Diff_t1)+Vslp=(Vcomp1_t3−Vslp)−(Vcomp1_t1−Vslp)+Vslp=(Vcomp1_t3−Vcomp1_t1)+Vslp. When Ra=Rb, SLP_L=(Vcomp1_t3−V compl_t1)+Vslp=α+Vslp (where α is shown in FIG. 5). As described above, at timing t4 at which the PWM dimming signal Dpwm2 is switched from a high level to a low level, the low level voltage SLP_L rises immediately. Therefore, the switching duty of PWM control performed by the power supply controller 11 becomes a required value immediately, and the overshoot of the LED current $I_{LED}1$ is suppressed (see the portion indicated by region A in FIG. 5).

Thereafter, at timing t5, which is earlier by a predetermined time TC than the timing t6 at which the PWM dimming signal Dpwm2 is switched from a low level to a high level, the first switch SW1 is turned on. Thus, a difference Diff_t5 between Vcomp1 and Vsht (=Vslp+α) is sampled in the first voltage holder 115A. Thereafter, at the timing t6, the first switch SW1 is turned off, and the difference Diff_t5 is held in the first voltage holder 115A (holding VH1). The second switch SW2 remains in the off state, and the changeover switch SSW is switched to the second electrical connection state in which the second terminal T2 and the third terminal T3 are electrically connected to each other. The low level voltage SLP_L decreases to (Vslp/Ra)×Rb=Vslp. The second electrical connection state is maintained while the PWM dimming signal Dpwm2 is at a high level. As described above, the low level voltage SLP_L decreases immediately to Vslp at timing t6. Therefore, the switching duty of the PWM control performed by the power supply controller 11 becomes a required value immediately, and the undershoot of the LED current $I_{LED}1$ is suppressed (see the portion indicated by region B in FIG. 5).

Thereafter, at timing t7, which is earlier by a predetermined time TD than timing t8 at which the PWM dimming signal Dpwm2 is switched from a high level to a low level, the second switch SW2 is turned on. Thus, a difference Diff_t7 between Vcomp1 and Vslp is sampled in the second voltage holder 115B. At this time, the first switch SW1 is maintained in the off state.

Thereafter, at timing t8, the second switch SW2 is turned off, and the difference Diff_t7 is held in the second voltage holder 115B (holding VH2). At this time, the changeover switch SSW is switched to the first electrical connection state. Thus, the low level voltage SLP_L=(Vsht/Ra)×Rb, and Vsht=(Diff_t7−Diff_t5)+Vslp=(Vcomp1_t7−Vslp)−(Vcomp1_t5−(Vslp+α))+Vslp. Since Vcomp1_t5=Vcomp1_t7, Vsht=Vslp+α and SLP_L=Vsht=Vslp+α. Therefore, the overshoot of the LED current $I_{LED}1$ is suppressed (see the portion indicated by region C in FIG. 5).

Second Embodiment

Figure 6:
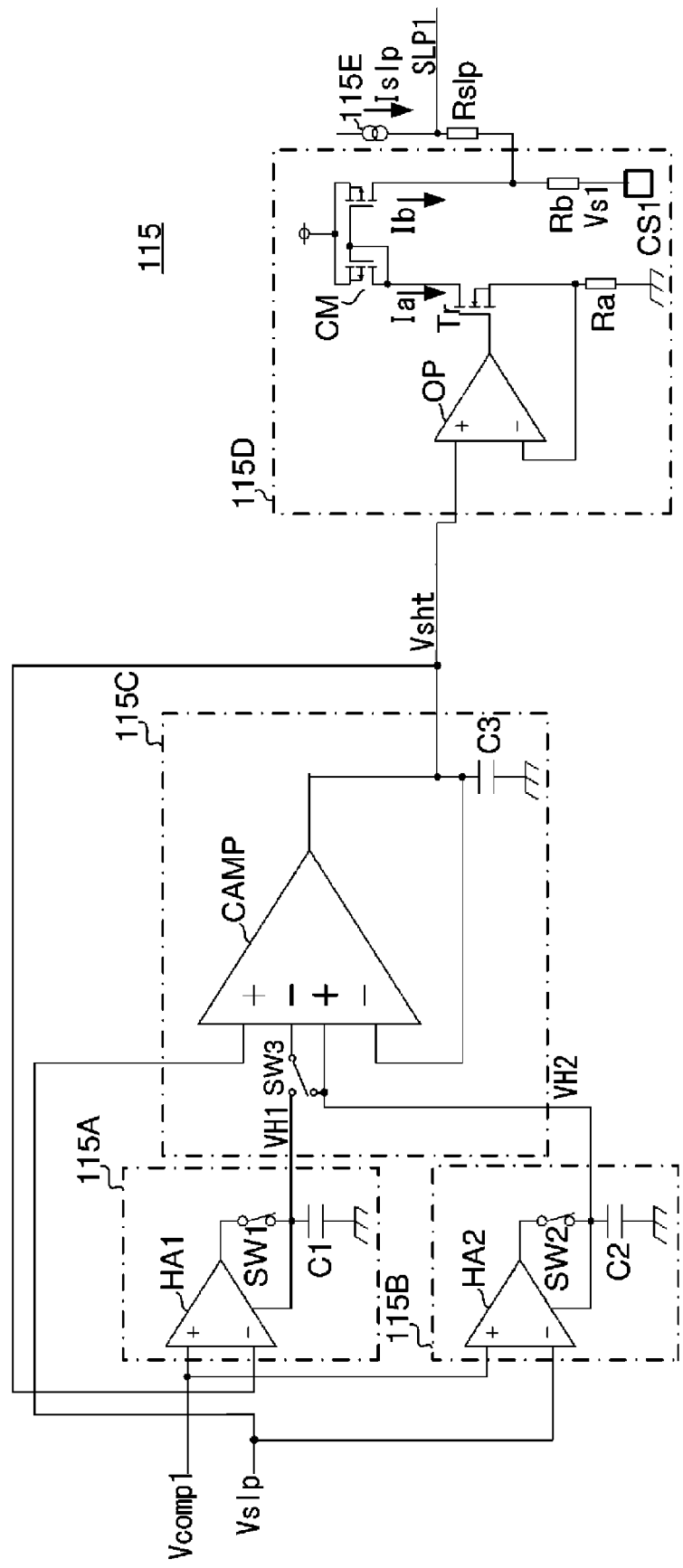
FIG. 6 is a view showing a configuration of a slope voltage generator according to a second embodiment.

FIG. 6 shows a configuration of the slope voltage generator 115 according to a second embodiment of the present disclosure. A difference between the present embodiment and the first embodiment lies in that a changeover switch SW3 is provided in the corrector 115C, instead of using the changeover switch SSW. The changeover switch SW3 switches electrical connection between the one end of the first capacitor C1, at which the first holding voltage VH1 is generated, and the first inverting input terminal of the correction amplifier CAMP, and electrical connection between the one end of the second capacitor C2, at which the second holding voltage VH2 is generated, and the first inverting input terminal of the correction amplifier CAMP. The output terminal of the correction amplifier CAMP is connected to the non-inverting input terminal of the operational amplifier OP.

Figure 7:
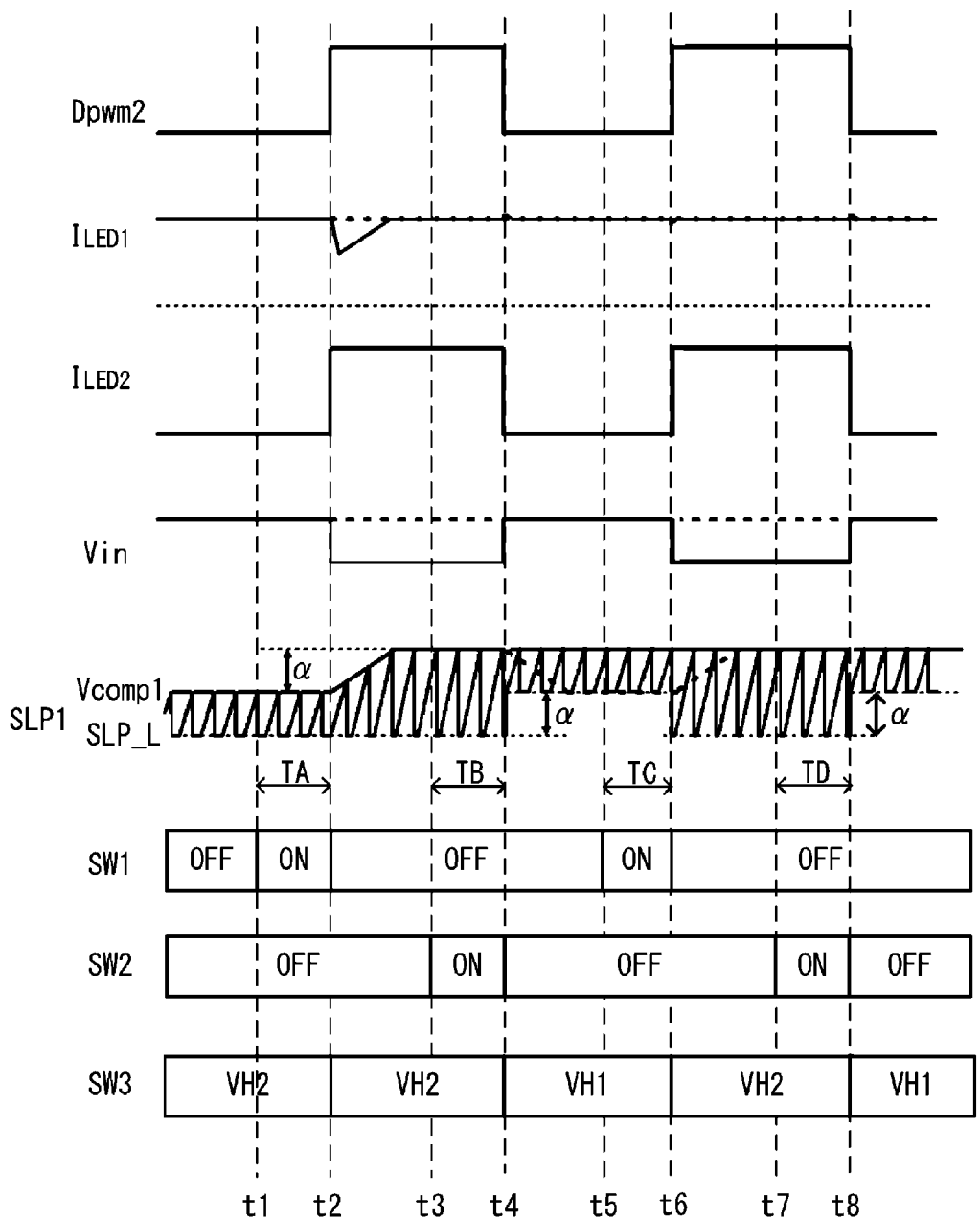
FIG. 7 is a timing chart showing an operation example according to the second embodiment.

FIG. 7 is a timing chart showing an operation example of the light emitting system 50 according to the present embodiment, and shows the PWM dimming signal Dpwm2, the LED current $I_{LED}1$, the LED current $I_{LED}2$, the input voltage Vin, the slope voltage SLP1, the error voltage Vcomp1, the state of the first switch SW1, the state of the second switch SW2, and a state of the changeover switch SW3 sequentially from the top. DC dimming is performed in the first channel, and PWM dimming is performed in the second channel. Further, the low level voltage SLP_L is also shown.

First, before timing t1, the PWM dimming signal Dpwm2 is at a low level (off level), the first switch SW1 is in an off state, and the second switch SW2 is in an off state. Further, the changeover switch SW3 is in a second electrical connection state in which the one end of the second capacitor C2 and the first inverting input terminal of the correction amplifier CAMP are electrically connected to each other. At this time, VH1=VH2=0, and Vsht=Vslp. The low level voltage SLP_L of the slope voltage SLP1=Ib×Rbt=(Vslp/Ra)×Rb. When Ra=Rb, SLP_L=Vslp.

Thereafter, at timing t1, which is earlier by the predetermined time TA than timing t2 at which the PWM dimming signal Dpwm2 is switched from a low level to a high level, the first switch SW1 is turned on. Thus, the difference Diff_t1 between Vcomp1 and Vsht (=Vslp) is sampled in the first voltage holder 115A. Thereafter, at timing t2, the first switch SW1 is turned off, and the difference Diff_t1 is held in the first voltage holder 115A (holding VH1). The second switch SW2 remains in the off state, and the changeover switch SW3 is maintained in the second electrical connection state. The low level voltage SLP_L is maintained at Vslp.

Thereafter, at timing t3, which is earlier by the predetermined time TB than timing t4 at which the PWM dimming signal Dpwm2 is switched from a high level to a low level, the second switch SW2 is turned on. Thus, the difference Diff_t3 between Vcomp1 and Vslp is sampled in the second voltage holder 115B. At this time, the first switch SW1 is maintained in the off state.

Thereafter, at timing t4, the second switch SW2 is turned off, and the difference Diff_t3 is held in the second voltage holder 115B (holding VH2). At this time, the changeover switch SW3 is switched to the first electrical connection state in which the one end of the first capacitor C1 and the first inverting input terminal of the correction amplifier CAMP are electrically connected to each other. Thus, the low level voltage SLP_L=Vsht=(Diff_t3−Diff_t1)+Vslp= (Vcomp1_t3−Vslp)−(Vcomp1_t1−Vslp)+Vslp= (Vcomp1_t3−Vcomp1_t1)+Vslp=α+Vslp (where α is shown in FIG. 7). As described above, at timing t4 at which the PWM dimming signal Dpwm2 is switched from a high level to a low level, the low level voltage SLP_L rises immediately. Therefore, the switching duty of PWM control performed by the power supply controller 11 becomes a required value immediately, and the overshoot of the LED current $I_{LED}1$ is suppressed.

Thereafter, at timing t5, which is earlier by the predetermined time TC than timing t6 at which the PWM dimming signal Dpwm2 is switched from a low level to a high level, the first switch SW1 is turned on. As a result, the difference Diff_t5 between Vcomp1 and Vsht (=Vslp+α) is sampled in the first voltage holder 115A. Then, at the timing t6, the first switch SW1 is turned off, and the difference Diff_t5 is held in the first voltage holder 115A (holding of VH1). The second switch SW2 remains in the off state, and the changeover switch SW3 is switched to the second electrical connection state. The low level voltage SLP_L decreases to Vslp. In this way, the low level voltage SLP_L immediately decreases to Vslp at the timing t6. Therefore, the switching duty of PWM control performed by the power supply controller 11 immediately becomes equal to a required value, and the undershoot of the LED current $I_{LED}1$ is suppressed.

Thereafter, at the timing t7, which is earlier by the predetermined time TD than the timing t8 at which the PWM dimming signal Dpwm2 is switched from a high level to a low level, the second switch SW2 is turned on. Thus, the difference Diff_t7 between Vcomp1 and Vslp is sampled in the second voltage holder 115B. At this time, the first switch SW1 is maintained in the off state.

Thereafter, at timing t8, the second switch SW2 is turned off, and the difference Diff_t7 is held in the second voltage holder 115B (holding VH2). At this time, the changeover switch SW3 is switched to the first electrical connection state. Thus, the low level voltage SLP_L=Vsht=(Diff_t7−Diff_t5)+Vslp=(Vcomp1_t7−Vslp)−(Vcomp1_t5−(Vslp+α))+Vslp. Since Vcomp1_t5=Vcomp1_t7, Vsht=Vslp+α and SLP_L=Vsht=Vslp+α. Therefore, the overshoot of the LED current $I_{LED}1$ is suppressed.

<Application to Backlight Device>

Figure 8:
FIG. 8 is a view showing a configuration example of a backlight device.

As an example of a target to which the LED drive device according to the above-described embodiments are applied, a backlight device will be described. In addition, the LED drive device may also be applied to a headlamp or the like. FIG. 8 shows a configuration example of the backlight device to which the LED drive device can be applied. The configuration shown in FIG. 8 is of a so-called edge-light type, but the present disclosure is not limited thereto and may be applied to a direct-type configuration.

A backlight device 70 shown in FIG. 8 is a lighting device that illuminates a liquid crystal panel 81 from a back side thereof. The backlight device 70 includes an LED light source device 71, a light guide plate 72, a reflection plate 73, and optical sheets 74. The LED light source device 71 includes LEDs and a substrate on which the LEDs are mounted. Light emitted from the LED light source device 71 enters the light guide plate 72 from a side surface thereof. For example, the light guide plate 72 made of an acrylic plate guides the incident light to an entirety of an interior thereof while totally reflecting the light, and emits the light as planar light from a surface on which the optical sheets 74 are disposed. The reflection plate 73 reflects the light leaking from the light guide plate 72 and returns the light into the light guide plate 72. The optical sheets 74 are constituted by a diffusion sheet, a lens sheet, and the like, and are intended to equalize and improve brightness of the light illuminating the liquid crystal panel 81. As the LED light source device 71, the light emitting systems of the various embodiments described above may be used.

<For In-vehicle Display>

The backlight device to which the LED drive device (light emitting system) according to the above-described embodiments is applied is particularly appropriate for being mounted on an in-vehicle display. In in-vehicle applications, a current flowing through the LEDs is relatively large, and a voltage resistance due to the wiring resistance RA becomes large, making the embodiments of the present disclosure more effective.

Figure 9:
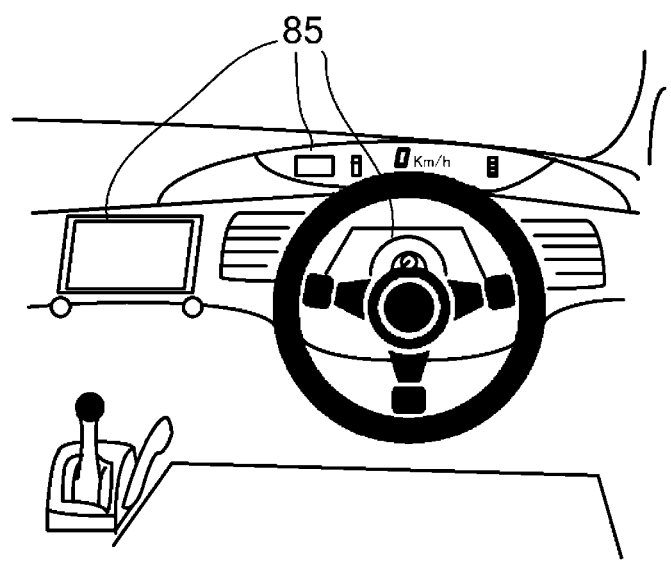
FIG. 9 is a view showing an example of an in-vehicle display.

The in-vehicle display is provided on a dashboard in front of a driver's seat of a vehicle, like an in-vehicle display 85 shown in FIG. 9, for example. The in-vehicle display 85 can display various images such as car navigation information, a captured image of a rear of the vehicle, a speedometer, a fuel gauge, a fuel consumption meter, a shift position, and the like, and can notify various information to a user. Such an in-vehicle display is also called a cluster panel or a center information display (CID). Alternatively, the in-vehicle display may be used as a rear entertainment device placed on a back side of the driver's seat or a front passenger seat, for example.

OTHERS

Although exemplary embodiments have been described above, the embodiments can be modified in various ways within the scope and spirit of the present disclosure.

For example, although the low level voltage is corrected in the above-described embodiments, the error voltage may also be corrected.

In addition, although the above-described embodiments are effective, for example, when the PWM dimming signal Dpwm2 is an internal signal, when the PWM dimming signal Dpwm2 is an external signal (a signal input from outside the LED drive device), the first voltage holder and the second voltage holder may perform sampling in a period between edges at respective levels (the off level and the on level) of the PWM dimming signal Dpwm2.

SUPPLEMENTARY NOTES

As described above, for example, a light emitting element drive device (1) according to the present disclosure, includes:
- a power supply controller (11) configured to perform switching control on a first switching power supply circuit (CH1) that supplies a first power supply voltage (Vout1) to a first light emitting element (100) based on an input voltage (Vin);
- an on-off controller (12) configured to control an on state and an off state of a second light emitting element (200) to which a second power supply voltage (Vout2) is supplied based on the input voltage;
- a first voltage holder (115A);
- a second voltage holder (115B); and
- a corrector (115C),
- wherein the power supply controller includes:
  - an error amplifier (112) configured to receive a current detection signal, which is obtained by detecting a current flowing through the first light emitting element, and a reference voltage; and
  - a comparator (113) configured to compare an error voltage output from the error amplifier and a slope voltage,
- wherein the first voltage holder is configured to hold a first difference voltage, which is a difference between the error voltage when the second light emitting element is in the off state and a first voltage (low level voltage) which is a lowest voltage of the slope voltage,
- wherein the second voltage holder is configured to hold a second difference voltage, which is a difference between the error voltage when the second light emitting element is in the on state and the first voltage of the slope voltage, and
- wherein the corrector is configured to correct a voltage difference between the error voltage and the first voltage of the slope voltage based on a difference between the second difference voltage and the first difference voltage (first configuration).

In addition, in the light emitting element drive device of the first configuration, the corrector may be configured to correct the first voltage of the slope voltage (second configuration).

In addition, in the light emitting element drive device of the first or second configuration, the on state and the off state of the second light emitting element may be controlled according to a level of a dimming signal,
- wherein the first voltage holder may be configured to sample the first difference voltage during a first predetermined period before a timing at which the dimming signal is switched from an off level to an on level, and
- wherein the second voltage holder may be configured to sample the second difference voltage during a second predetermined period before a timing at which the dimming signal is switched from the on level to the off level (third configuration).

In addition, the light emitting element drive device of any one of the first to third configurations may further include a first voltage generator (115D) configured to generate the first voltage of the slope voltage, and a changeover switch (SSW),
- wherein the first voltage holder (115A) may include a first amplifier (HA1), a first capacitor (C1), and a first switch (SW1) connected between an output terminal of the first amplifier and the first capacitor,
- wherein the second voltage holder (115B) may include a second amplifier (HA2), a second capacitor (C2), and a second switch (SW2) connected between an output terminal of the second amplifier and the second capacitor,
- wherein the corrector (115C) may include a correction amplifier (CAMP), and a third capacitor (C3) connected to an output terminal of the correction amplifier,
- wherein the first amplifier may be configured to receive the error voltage and an output of the correction amplifier,
- wherein the second amplifier may be configured to receive the error voltage and a fixed voltage (Vslp),
- wherein the correction amplifier may be configured to receive the fixed voltage, an output of the first voltage holder, an output of the second voltage holder, and a voltage of the third capacitor, and
- wherein the changeover switch may be configured to switch electrical connection between the output of the correction amplifier and the first voltage generator and electrical connection between the fixed voltage and the first voltage generator (fourth configuration).

In addition, the light emitting element drive device of any one of the first to third configurations may further include a first voltage generator configured to generate the first voltage of the slope voltage,
- wherein the first voltage holder may include a first amplifier, a first capacitor, and a first switch connected between an output terminal of the first amplifier and the first capacitor,
- wherein the second voltage holder may include a second amplifier, a second capacitor, and a second switch connected between an output end of the second amplifier and the second capacitor,
- wherein the corrector may include a correction amplifier, a third capacitor connected to an output terminal of the correction amplifier, and a third switch (SW3),
- wherein the first amplifier may be configured to receive the error voltage and an output of the correction amplifier,
- wherein the second amplifier may be configured to receive the error voltage and a fixed voltage,
- wherein the correction amplifier may have a first inverting input terminal, a first non-inverting input terminal, a second inverting input terminal, and a second non-inverting input terminal,
- wherein the first non-inverting input terminal may be connected to a first terminal of the second capacitor,
- wherein the second non-inverting input terminal may be connected to an application terminal of the fixed voltage,
- wherein the second inverting input terminal may be connected to a first terminal of the third capacitor and the output terminal of the correction amplifier, wherein the output of the correction amplifier may be input to the first voltage generator, and wherein the third switch may be configured to switch electrical connection between a first terminal of the first capacitor and the first inverting input terminal and electrical connection between the first terminal of the second capacitor and the first inverting input terminal (fifth configuration).

In addition, in the light emitting element drive device of the fourth or fifth configuration, the first voltage generator (115D) may include:

an operational amplifier (OP) having a first input terminal and a second input terminal;

a transistor (Tr) having a control terminal connected to an output terminal of the operational amplifier;

a first resistor (Ra) connected between a first terminal of the transistor and an application terminal of a ground potential;

a current mirror (CM) having an input terminal connected to a second terminal of the transistor; and a second resistor (Rb) connected to an output terminal of the current mirror, wherein the output of the correction amplifier may be input to the first input terminal, and wherein a node to which the transistor and the first resistor are connected may be connected to the second input terminal (sixth configuration).

In addition, in the light emitting element drive device of any one of the first to sixth configurations, the first light emitting element and the second light emitting element may be light emitting diodes (seventh configuration).

In addition, one embodiment of the present disclosure is a light emitting system including: the light emitting element drive device of any one of the first to seventh configurations; the first light emitting element; and the second light emitting element (eighth configuration).

In addition, the light emitting system of the eighth configuration may be an in-vehicle system (ninth configuration).

The present disclosure can be used, for example, as a driving means for an in-vehicle LED.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A light emitting element drive device, comprising:
a power supply controller configured to perform switching control on a first switching power supply circuit that supplies a first power supply voltage to a first light emitting element based on an input voltage;
an on-off controller configured to control an on state and an off state of a second light emitting element to which a second power supply voltage is supplied based on the input voltage;
a first voltage holder;
a second voltage holder; and
a corrector,
wherein the power supply controller includes:

an error amplifier configured to receive a current detection signal, which is obtained by detecting a current flowing through the first light emitting element, and a reference voltage; and
a comparator configured to compare an error voltage output from the error amplifier and a slope voltage,
wherein the first voltage holder is configured to hold a first difference voltage, which is a difference between the error voltage when the second light emitting element is in the off state and a first voltage which is a lowest voltage of the slope voltage,
wherein the second voltage holder is configured to hold a second difference voltage, which is a difference between the error voltage when the second light emitting element is in the on state and the first voltage of the slope voltage, and
wherein the corrector is configured to correct a voltage difference between the error voltage and the first voltage of the slope voltage based on a difference between the second difference voltage and the first difference voltage.

2. The light emitting element drive device of claim 1, wherein the corrector is configured to correct the first voltage of the slope voltage.

3. The light emitting element drive device of claim 1, wherein the on state and the off state of the second light emitting element are controlled according to a level of a dimming signal,
wherein the first voltage holder is configured to sample the first difference voltage during a first predetermined period before a timing at which the dimming signal is switched from an off level to an on level, and
wherein the second voltage holder is configured to sample the second difference voltage during a second predetermined period before a timing at which the dimming signal is switched from the on level to the off level.

4. The light emitting element drive device of claim 1, further comprising a first voltage generator configured to generate the first voltage of the slope voltage, and a changeover switch,
wherein the first voltage holder includes a first amplifier, a first capacitor, and a first switch connected between an output terminal of the first amplifier and the first capacitor,
wherein the second voltage holder includes a second amplifier, a second capacitor, and a second switch connected between an output terminal of the second amplifier and the second capacitor,
wherein the corrector includes a correction amplifier, and a third capacitor connected to an output terminal of the correction amplifier,
wherein the first amplifier is configured to receive the error voltage and an output of the correction amplifier,
wherein the second amplifier is configured to receive the error voltage and a fixed voltage,
wherein the correction amplifier is configured to receive the fixed voltage, an output of the first voltage holder, an output of the second voltage holder, and a voltage of the third capacitor, and
wherein the changeover switch is configured to switch electrical connection between the output of the correction amplifier and the first voltage generator and electrical connection between the fixed voltage and the first voltage generator.

5. The light emitting element drive device of claim 4, wherein the first voltage generator includes:

an operational amplifier having a first input terminal and a second input terminal;
a transistor having a control terminal connected to an output terminal of the operational amplifier;
a first resistor connected between a first terminal of the transistor and an application terminal of a ground potential;
a current mirror having an input terminal connected to a second terminal of the transistor; and
a second resistor connected to an output terminal of the current mirror,
wherein the output of the correction amplifier is input to the first input terminal, and wherein a node to which the transistor and the first resistor are connected is connected to the second input terminal.

6. The light emitting element drive device of claim 1, further comprising a first voltage generator configured to generate the first voltage of the slope voltage,
wherein the first voltage holder includes a first amplifier, a first capacitor, and a first switch connected between an output terminal of the first amplifier and the first capacitor,
wherein the second voltage holder includes a second amplifier, a second capacitor, and a second switch connected between an output terminal of the second amplifier and the second capacitor,
wherein the corrector includes a correction amplifier, a third capacitor connected to an output terminal of the correction amplifier, and a third switch,
wherein the first amplifier is configured to receive the error voltage and an output of the correction amplifier,
wherein the second amplifier is configured to receive the error voltage and a fixed voltage,
wherein the correction amplifier has a first inverting input terminal, a first non-inverting input terminal, a second inverting input terminal, and a second non-inverting input terminal,
wherein the first non-inverting input terminal is connected to a first terminal of the second capacitor,
wherein the second non-inverting input terminal is connected to an application terminal of the fixed voltage,
wherein the second inverting input terminal is connected to a first terminal of the third capacitor and the output terminal of the correction amplifier,
wherein the output of the correction amplifier is input to the first voltage generator, and
wherein the third switch is configured to switch electrical connection between a first terminal of the first capacitor and the first inverting input terminal and electrical connection between the first terminal of the second capacitor and the first inverting input terminal.

7. The light emitting element drive device of claim 6, wherein the first voltage generator includes:
an operational amplifier having a first input terminal and a second input terminal;
a transistor having a control terminal connected to an output terminal of the operational amplifier;
a first resistor connected between a first terminal of the transistor and an application terminal of a ground potential;
a current mirror having an input terminal connected to a second terminal of the transistor; and
a second resistor connected to an output terminal of the current mirror,
wherein the output of the correction amplifier is input to the first input terminal, and
wherein a node to which the transistor and the first resistor are connected is connected to the second input terminal.

8. The light emitting element drive device of claim 1, wherein the first light emitting element and the second light emitting element are light emitting diodes.

9. A light emitting system, comprising:
the light emitting element drive device of claim 1;
the first light emitting element; and
the second light emitting element.

10. The light emitting system of claim 9, which is an in-vehicle system.

* * * * *